Oct. 31, 1972 E. J. METS 3,701,696

PROCESS FOR SIMULTANEOUSLY GETTERING, PASSIVATING AND LOCATING A JUNCTION WITHIN A SILICON CRYSTAL

Filed Aug. 20, 1969 2 Sheets-Sheet 1

INVENTOR:
EDWIN J. METS,
BY Carl O. Thomas
HIS ATTORNEY.

INVENTOR:
EDWIN J. METS,
BY Carl O. Thomas
HIS ATTORNEY.

United States Patent Office 3,701,696

Patented Oct. 31, 1972

3,701,696

PROCESS FOR SIMULTANEOUSLY GETTERING, PASSIVATING AND LOCATING A JUNCTION WITHIN A SILICON CRYSTAL

Edwin J. Mets, Skaneateles, N.Y., assignor to General Electric Company

Filed Aug. 20, 1969, Ser. No. 851,595
Int. Cl. H01l 7/36, 5/00; B01j 17/00
U.S. Cl. 148—175 8 Claims

ABSTRACT OF THE DISCLOSURE

An epitaxial layer is deposited onto a silicon crystal with the layer and adjacent crystal surface being of opposite conductivity types and the epitaxial layer containing a higher impurity concentration. The adjacent crystal surface is then converted to the conductivity type of the epitaxial layer to displace the junction into the crystal away from the epitaxial layer. Silicon dioxide is formed on the exterior surfaces of the crystal to act as a passivation layer. Both steps are performed concurrently by heating the crystal in an oxidizing atmosphere. A stressed region may be formed on the crystal prior to heating that will trap fast diffusing impurity atoms during heating. In one form the silicon crystal is grooved so that the grooved surfaces intersect the final location of the junction, and the crystal is sub-divided along groove trough areas to form separately useable, discrete elements.

Figure 1A:
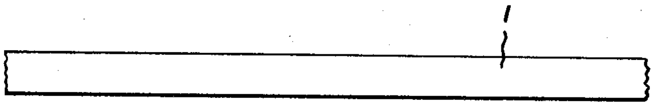

My invention relates to a process for conveniently and efficiently providing silicon crystals or pellets for semiconductor devices which is suited to simultaneously processing many pellets within a single crystalline wafer and obtaining discrete pellets having improved voltage blocking characteristics.

It is by now well understood how to manufacture semiconductor devices capable of blocking extremely high voltage differentials across their terminals. Unfortunately, the structural arrangements which result in the most desirable electrical characteristics have been largely limited in applicability to manufacturing approaches in which each semiconductive crystal or pellet to be incorporated into a semiconductor device is separately processed and handled.

Because of the extreme cost competitiveness of the semiconductor industry, manufacturing techniques have been developed capable of simultaneously processing semiconductive crystals or pellets for a large number of semiconductor devices while still associated within a single large crystalline disc or wafer. Wafer processing has greatly reduced the unit cost of semiconductive crystals and hence the cost of the semiconductor devices. However, the advantages of mass handling of semiconductive pellets are obtained only by accepting relatively low level electrical performance capabilities and by the necessity of rejecting substantial quantities of completed semiconductor devices due to semiconductive crystal damage produced in fabrication. For example, whereas four layer, three junction thyristor pellets can be individually manufactured capable of reliably providing semiconductor devices capable of blocking terminal applied potentials well in excess of 1000 volts, thyristors having semiconductive crystals formed and processed en masse typically exhibit voltage blocking characteristics well below 400 volts. This is no disadvantage to applications requiring low blocking voltage capabilities, but, obviously, the range of applications for such devices are limited by this parameter. Further, a substantial number of the semiconductor devices produced by such mass handling techniques must be discarded or downgraded as failing to meet even these modest performance criteria due to mechanical damage in processing and assembly.

It is an object of my invention to provide a process suitable for simultaneously fabricating silicon pellets from a single silicon wafer in which the wafer can be more easily processed without damage, the pellets are positively beveled, passivated, and the junction sites located to improve voltage blocking characteristics, and processing to effect a plurality of pellet parameters is consolidated in a controlled and interrelated manner to reduce total processing time and costs.

This and other objects of my invention are, according to one aspect of my invention, accomplished by a process of forming a semiconductor device of improved voltage blocking characteristics comprised of epitaxially depositing onto a silicon crystal having a first zone of a first conductivity type a second zone of a second, opposite conductivity type having a lower resistivity than the first zone to form a junction initially located between the zones. A portion of the first zone adjacent the second zone is converted to the second conductivity type, thereby moving the junction into the first zone away from the epitaxially deposited second zone. Silicon dioxide is created on the silicon crystal surface at its intersection with the junction in the first zone. The steps of converting the conductivity type of a portion of the first zone and of forming silicon dioxide are performed simultaneously and in a controlled and interrelated manner by heating the silicon crystal in an oxidizing atmosphere.

According to a preferred practice of my inventive process, a stressed region may be formed on a surface of the silicon crystal. By heating the crystal to form a passivation layer and to move the junction into the first zone crystal dislocations are formed in the stressed region which act as traps for fast diffusing impurities, such as iron. Removal of the stressed regions from the silicon crystal thereby removes the trapped impurities and contributes to improved voltage blocking characteristics.

When my process is applied to forming multiple pellets from a single silicon wafer, the wafer may be grooved, as by etching, through the first zone to a depth adjacent the second zone to separate at least a major portion of the first zone into sectors. Upon heating in an oxidizing atmosphere silicon dioxide may then be deposited over the grooved surfaces of the wafer, and the wafer may be sub-divided through portions of the second zone underlying groove trough areas to form separately useable silicon crystal elements or pellets each including a sector of the first zone.

Figure 1B:
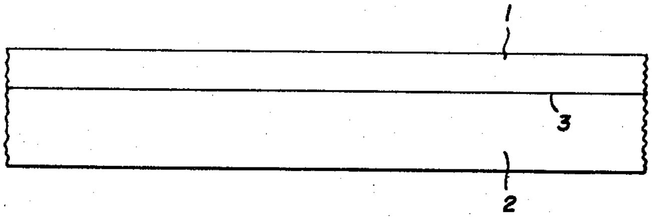
Figure 1C:
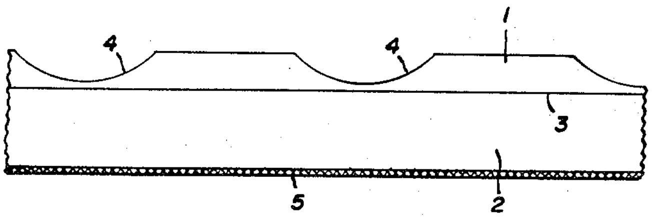
Figure 1D:
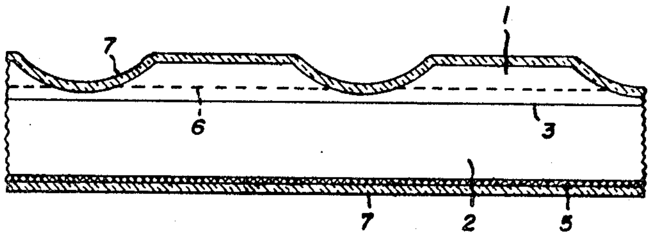
Figure 1E:
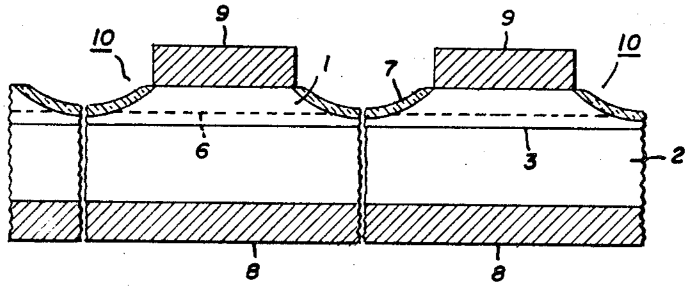

My invention may be better understood by reference to the following detailed description considered in conjunction with the drawings, in which:

FIGS. 1*a*–1*e* inclusive are sectional schematic details illustrating various stages of fabricating a silicon semiconductor diode according to my invention, FIG. 1*a* depicting a silicon crystalline wafer formed of a first zone, FIG. 1*b* depicting the silicon crystalline wafer with a second zone epitaxially attached thereto, FIG. 1*c* depicting the silicon wafer with the first zone grooved and the second zone stressed, FIG. 1*d* depicting the silicon wafer after heating with the junction location shifted from the interface between the zones and an oxide layer overlying the crystal surfaces, and FIG. 1*e* representing a plurality of separately useable silicon diode crystals with contact metalization associated incorporating silicon pellets from the wafer; and FIGS. 2*a*–2*e* inclusive are sectional schematic details comparable to FIGS. 1*a*–1*e* inclusive illustrating various stages of fabricating a silicon controlled rectifier thyristor according to my invention.

In the practice of my process I utilize as a starting substrate a silicon crystalline wafer which may be of either P or N conductivity type. Where it is desired to form many separately useable pellets from a single wafer, the wafer is typically of large diameter as compared to its thickness. For example, silicon wafers produced by float zone processing are typically 1 to 2 inches in diameter and 4 to 10 mils in thickness or, alternately stated, the diameter to thickness ratios for these wafers range from 100:1 to 500:1. Such thin silicon wafers are quite brittle and, unless carefully handled in processing according to conventional techniques, may be mechanically damaged. In FIG. 1*a* a wafer 1 to be used as a starting substrate is schematically shown in sectional detail. The wafer segment shown is enlarged many times.

My invention may be applied with particular advantage to processing large diameter thin wafers, since at the outset I deposite onto one major surface of the wafer an additional layer of silicon which is of a conductivity type differing from that of the substrate and which is more heavily doped with impurity atoms, so that its resistivity is lower. This may be accomplished by my conventional epitaxial deposition technique. The epitaxial layer forms a junction with the substrate at their intersection. Looking at FIG. 1*b* it can be seen that layer 1 forms a first zone of a first conductivity type while layer 2, which is shown beneath layer 1 but is epitaxially grown onto layer 1 as a substrate, forms a second zone of a second, opposite conductivity type. The interface 3 between the zones constitutes a junction. The advantage of epitaxially depositing the layer 2 is that this provides a very rapid technique for increasing the thickness and hence strength of the wafer while at the same time providing a junction that lies well within the silicon crystal.

Assuming the substrate 1 to have a thickness comparable to typical thin wafers—i.e., 4 to 10 mils—a junction depth is obtained quickly by epitaxy that would require many hours to obtain by conventional diffusion techniques. It is, of course, recognized that since the wafer substrate to be utilized is at the outset of my process strengthened by the addition of an epitaxial layer, the substrate may be somewhat thinner than would be practical using conventional processing.

Where it is desired to subsequently sub-divide the silicon crystal into a plurality of discrete, separately useable smaller silicon crystals or pellets, it is desirable to groove the silicon crystal through the first zone or substrate so that the groove extends to a point adjacent the interface 3 between the first and second zones. It is a distinct advantage of my invention that it is not necessary that the grooves intersect or traverse the intersection of the two zones. This avoids the disadvantage of structurally weakening the second zone and rendering the silicon crystal susceptible to mechanical damage in further handling. Instead, I leave the second zone entirely unweakened by grooving.

The grooves may be formed in any conventional pattern and manner. In order to achieve the maximum utilization of silicon the grooves are typically formed in perpendicularly intersecting sets of parallel, rectilinear grooves resulting in an intersecting grid pattern. Other groove patterns such as tangentially impinging annular grooves, hexagonal grooves, etc., are possible. The grooves may be formed mechanically by lapping or grinding, but are preferably formed by etching. Etched grooves are particularly advantageous in that they allow positive beveling as is explained more fully below. In FIG. 1*c* the first zone of the silicon crystal is shown provided with a plurality of etched grooves 4.

In FIG. 1*c* the epitaxial layer or second zone is shown provided with a stressed region 5. The purpose of the stressed region is to provide a source of traps for fast diffusing impurities such as iron. The region 5 need extend only a very slight distance into the silicon and is typically confined to a few microns in depth. Stressing may be accomplished by mechanically abrading the surface of the second zone. For example, the surface of the crystal may be sandblasted or lapped. Instead of mechanically stressing the surface of the second zone relatively slow diffusing impurity atoms may be introduced into the second zone to introduce crystal lattice defects that will act as impurity traps. For example, where the second zone is formed of P type silicon boron is particularly suited to forming a stressed surface region by substitutional diffusion; for N type silicon phosphorus may be used. It is immaterial whether the stressed region is formed before or after grooving of the first zone.

The silicon crystalline wafer of FIG. 1*c* could, if desired, be sub-divided along the groove troughs to form a plurality of discrete separately useable semiconductor elements or pellets. Such pellets would, like many pellets sub-divided from wafers formed by conventional techniques, exhibit very low voltage, blocking characteristics, however. In such instance the junction between the zones of each pellet would not intersect the beveled groove, but the scribed or sawn edge along which the pellets are sub-divided. In this instance, of course, no passivation layer would be present at the junction intersection with the periphery of the pellets. Accordingly, destructive surface breakdown of the pellets would occur on reverse biasing of the pellets beyond very low voltage levels. But even absent the problem of low level surface breakdown of the pellets when biased in the blocking direction, the pellets could not withstand any more than low to moderate breakdown voltages because of defects within the bulk of the pellets. With the junction located at the interface of the original substrate and the epitaxial layer a substantial number of lattice defects are present within the epitaxial layer adjacent the junction which prevent attainment of high blocking voltages. Additionally, high mobility impurity atoms such as iron may be present within the crystal which will prevent achieving high blocking voltages.

It is by now well understood in the art that a silicon dioxide passivation layer may be grown on the surface of a silicon crystal by heating the crystal in an oxidizing atmosphere. Oxide formation is typically achieved within the temperature range of from 900 to 1200° C. As is well understood the thickness of the oxide layer formed is a function of the time and temperature of heating and the character of the oxidant used. The presence of moisture in the oxidizing atmosphere increases the rate of formation of the oxide layer above that for a substantially dry oxidizing atmosphere. It may be desirable to purge the oxidizing atmosphere and cool the surface oxidized silicon crystal in an atmosphere of a dry gas such as dry oxygen or argon, so as to remove any traces of water vapor from the silicon dioxide layer, thereby producing a more stable oxide layer. As employed herein the term "passivation layer" refers to the ability of this layer to improve the stability of the electrical properties of the silicon crystal over observed stability levels when the surface of the silicon is exposed to the ambient environment. Even very thin oxide layers of only a few thousand angstroms improve stability. While it is possible to grow relatively thick oxide layers in the range of 20,000 to 30,000 angstroms, it is contemplated that the passivation layer will be supplemented in stabilizing the electrical properties of the silicon crystal by the use of known crystal encapsulation techniques. Accordingly, it is unnecessary and usually not desirable that the oxide layer be of sufficient thickness to itself fully stabilize the silicon crystal.

It is my recognition that in heating the siilcon crystalline wafer to form an oxide passivation layer I can simultaneously move the rectifying junction of the crystal away from the interface of the first and second zones into the first zone or substrate. This is attainable, since the epitaxial layer is initially chosen to have a higher impurity atom concentration and hence a lower resistivity than the substrate. Heating during oxidation then drives these excess impurity atoms into the substrate. This greatly upgrades the voltage blocking characteristics of the junction for several reasons. First, the locus of the junction is shifted to a portion of the silicon crystal where the crystal lattice exhibits a greater degree of regularity and freedom from defects. This improves the bulk voltage blocking characteristics of the junction.

Second, the location of the junction is shifted so that it intersects the beveled edge of the etched grooves. This increases the voltage blocking capabilities of the junction, since beveling is well known to have the ability to spread the field gradient at the surface of a silicon crystal so that the maximum voltage blocking capabilities are increased. But even if the reverse breakdown voltage is reached, breakdown will occur through the bulk of the crystal in a non-destructive manner rather than through destructive surface breakdown. It is, of course, recognized that not all beveling inherently improves voltage blocking characteristics. Note, for example, the article Control of Electric Field at the Surface of P-N Junctions by R. L. Davies and F. E. Gentry, published July 1964, in the IEEE Transactions on Electron Devices. Negative bevels may actually be detrimental, unless carefully controlled within a rather narrow range of bevel angles, usually from about 4 to 12 degrees. It is to be noted that in my process by etching through the first zone, which is of higher resistivity, toward the interface with the second zone I provide blocking voltage improving positive bevel angles. Thus, there is no necessity of critically controlling the final location of the junction in relation to the slope of the grooved surface, since all positive beveled surfaces are to some extent advantageous in achieving field spreading at the junction. On the other hand, where very high voltage blocking characteristics are desired, the groove depth may be related to the final location of the junction to produce the desired voltage blocking characteristics. Where the junction intersects the grooves adjacent the groove troughs a very shallow positive bevel angle is present at the intercept of the groove surfaces with the junction that has a very desirable field spreading effect.

It is a distinctive feature of my invention that I drive the junction into the first zone away from the second zone or epitaxial layer by a distance sufficient to maintain the depletion layer associated with the junction under contemplated blocking conditions within the first zone and spaced from the second zone at all times. This keeps the depletion layer away from crystal defects lying within the second zone adjacent the interface between the zones and avoids any tendency toward low voltage bulk breakdown of the crystals.

Simultaneous with displacement of the junction away from the interface between zones and formation of an oxide passivation layer, the silicon crystal is heated to a state where the stressed regions in the second zone begin to form crystal dislocations that relieve the stress. These crystal dislocations serve as traps within the crystal lattice for fast diffusing impurities such as iron that can be detrimental to the electrical performance of the crystal even when present in quantities well below 1 part per million. At temperatures above 900° C. the crystal is sufficiently plastic to allow such traps to form. The duration of heating is not critical to either oxide passivation or gettering of fast diffusants, since usually the heating period to displace the junction will be comparatively long and set the minimum acceptable heating time. To achieve success in gettering, however, gradual cooling of the silicon crystal must occur. While the cooling rate may vary widely without adverse effect, it should at all times be maintained below the cooling rate for quenching. A normal oven cooling rate of about 250° C. per hour has been found quite successful.

In FIG. 1*d* the silicon wafer is schematically shown as it appears immediately after heating according to my invention. A junction 6 shown by dashed lines intersects the surfaces of the grooves 4 adjacent their troughs so that a shallow positive angle is formed at the intercept of the grooved surfaces with the junction 6. The interface 3 between the zones is now relatively displaced from the junction so that it is outside of any depletion layer that may be formed by reverse biasing within contemplated voltages. The stressed region 5 is shown with lattice dislocations introduced in which fast diffusing impurities such as iron are trapped. An oxide passivation layer 7 overlies all exterior surfaces of the silicon crystalline wafer. It is to be particularly noted that the passivation layer overlies the edge intercept of the junction 6 with the grooved surfaces, so that the edge of the junctions are passivated.

In order to convert the silicon crystalline wafer of FIG. 1*d* into a plurality of separately useable silicon semiconductor devices the oxide layer 7 and impurity containing region 5 are removed from the exterior surface of the second zone or epitaxial layer. This may be accomplished by etching or by mechanical abrading techniques. This assures that the impurities cannot escape from the traps in use, particularly at elevated temperatures. Oxide is also removed from the flat, ungrooved surfaces of the first zone or substrate. The exposed surfaces of the silicon crystal may then be covered with one or a combination of metal contact layers to provide ohmic connections to the crystal. In order to form a plurality of silicon pellets the crystal may be sub-divided, preferably along the groove troughs, by scribing or sawing. It is to be noted that subdivision of the wafer into discrete pellets preferably constitutes the last step of my process; thus handling of individual pellets in processing is largely avoided.

In FIG. 1*e* the resultant structure is illustrated immediately after completion of the above process steps. A plurality of silicon diode pellets 10 each are provided with an ohmic contact 8 bonded to the second zone 2 and an ohmic contact 9 bonded to the first zone 1. It is to be noted that while a portion of the peripheral edge of the pellets is exposed, the portion of the periphery that intersects the junction 6 is covered by the oxide passivation layer 7 so that the exposed sawn or scribed edges of the pellets have a minimal effect on blocking voltage characteristics. The resultant structure is further encapsulated and packaged for use according to conventional techniques.

While I have disclosed my invention with reference to the fabrication of a number of silicon diodes from a single silicon crystal, it is appreciated that this is only exemplary of one of a number of applications suitable for the practice of my process. My invention could, for instance, be applied to the fabrication of silicon pellets individually. In such instance it would not be essential to etch the silicon crystal, although this could still be done, if desired, for the purpose of beveling the periphery of the single silicon crystal. While the gettering technique I have disclosed represents a convenient and efficient approach for trapping fast diffusants, it is appreciated that other gettering techniques are known to the art and may be substituted in specific applications.

Figure 2A:
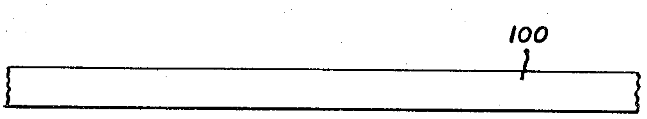

My invention is, of course, well suited to the formation of silicon pellets for use in semiconductor devices other than diodes. For example, in FIGS. 2*a*–2*e* inclusive I illustrate a generally comparable, although somewhat more complex process for forming a silicon controlled rectifier of improved voltage blocking characteristics according to my invention. As shown in FIG. 2*a* a substrate 100 which may, for example, be a wafer of float zone silicon is used as a substrate. The substrate forms a first zone onto which a second zone 101 is deposited epitaxially as well as a third zone 102. The second and third zones form interfaces 103 and 104 with the first zone respectively. Both the second and third zones are of a conductivity type opposite to that of the substrate and are provided with a higher impurity concentration and hence lower resistivity than the substrate. Shallow emitters 105 may be diffused or otherwise suitably formed in the epitaxial layer 102.

Figure 2B:
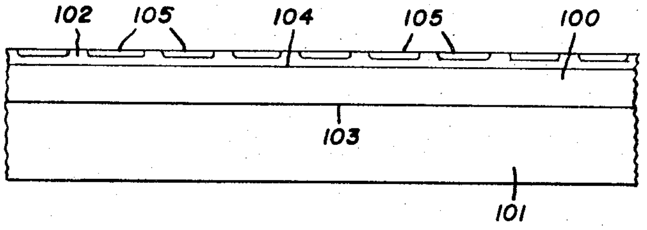

The emitter 105 may be confined to less than the total surface of the third zone by masking. The emitter forms a fourth zone. The relationship of the zones immediately after formation is shown in FIG. 2*b*.

Figure 2C:
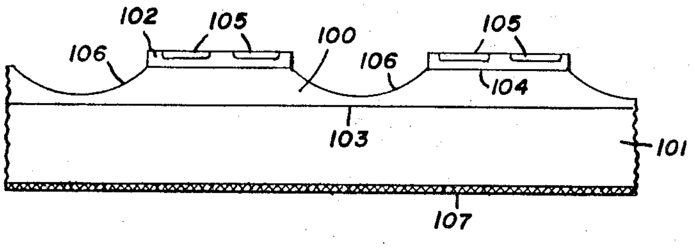

As shown in FIG. 2*c* grooves 106 are formed in the first zone and extending through the third zone. The groove troughs are located adjacent the second zone 101. Here again a high strength wafer is maintained by avoiding etching into the second zone. A stressed region 107 is formed on the lower surface of the second zone to produce traps for fast diffusants.

Figure 2D:
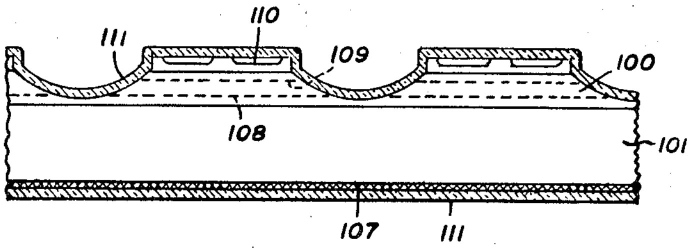

To drive the junctions between the first and second zones and the first and third zones into the first zone away from the interfaces of the first zone with the epitaxial layers, to provide a silicon dioxide passivant coating, and to form trapping sites within the stressed region, the silicon wafer is heated within an oxidizing atmosphere similarly as in the fabrication of the silicon diode wafer. As shown in FIG. 2*d* a first junction 108 and a second junction 109 are shown by dashed lines lying within the first zone 100 forming emitter-base and collector junctions, respectively. A third junction 110 remains located substantially at the interface of the third and fourth zones. The exact location of this junction after heating is not critical, since this base-emitter junction is not relied upon to impart blocking voltage qualities, as is generally well understood in the art. An oxide layer 111 overlies the exterior surfaces of the silicon wafer including the grooved surfaces and overlies the intersection of the first and second juntcions with the grooved surfaces.

Figure 2E:
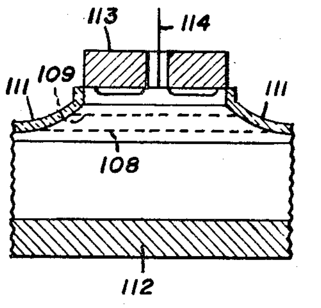

In FIG. 2*e* a portion of silicon wafer formed by sawing or scribing through the groove troughs is shown fabricated into a form suitable for use as a separate semiconductively active element of a thyristor. The stressed region together with the associated trapped impurities is removed by etching or abrading together with the overlying oxide layer. The portion of the oxide overlying the ungrooved surfaces of the third and fourth zones is also removed. Over the exposed area of the second zone one or a combination of conventional ohmic contact layers 112 are positioned. Similarly, an annular ohmic contact 113 is positioned over the unetched portion of the third zone and the fourth zone. A gate or control lead 114 is schematically shown connected to the third zone interiorly of the annular contact 113. The contact 113 is noted to short across the junction 110 to reduce the temperature sensitivity of the device and to reduce the susceptibility of the device to turn on with rapid increases in applied voltage. It is to be noted that the voltage blocking junctions 108 and 109 are passivated and protected against voltage breakdown similarly as the junction 6. There is one significant difference, however, as regards junction 109. This junction is negatively rather than positively beveled. But the amount of beveling is slight as the junction bevel angle approaches 90° at its point of intersection with the groove surfaces, so that the adverse bevel angle has a minimal adverse influence on voltage breakdown.

The thyristor formation of FIGS. 2*a*–2*e* inclusive is merely intended to illustrate the application of my invention to the formation of a thyristor and is not intended to be limiting. For example, my invention could be utilized to produce a single thyristor crystal element from a silicon wafer, if desired. In such instance beveling would not be essential, although etching of grooves could be practiced for this purpose. The third zone could, if desired, be formed by diffusion rather than epitaxy. In such case it is immaterial if the junction between the first and third zones moves during heating away from its original position. Still other variations will readily occur to those skilled in the art.

What I claim and desire to secure by Letters Patent of the United States is:

1. A process of forming a semiconductor device of improved voltage blocking characteristics comprising epitaxially depositing onto a silicon crystal having a first zone of a first conductivity type a second zone of a second, opposite conductivity type having a lower resistivity than the first zone to form a junction initially located between the zones, forming a stressed region on a surface of the second zone, heating the silicon crystal, after epitaxial deposition and stressing, in an oxidizing atmosphere to convert a portion of the first zone adjacent the second zone to the second conductivity type thereby moving the junction into the first zone away from the epitaxially deposited second zone, simultaneously to deposit silicon dioxide on the silicon crystal surface at its intersection with the junction in the first zone, and simultaneously to form crystal dislocations in the stressed region capable of acting as traps for fast diffusing iron impurities, removing the stressed region of the second zone to thereby remove iron impurities.

2. A process according to claim 1 in which the silicon crystal is heated to drive the junction into the first zone by a distance greater than the width of the depletion layer spreading from the junction toward the second zone when the maximum contemplated blocking voltage is applied to the semiconductor crystal so that the depletion layer is at all times spaced from the second layer.

3. A process according to claim 1 in which the stressed region is formed on an epitaxially deposited portion of the silicon crystal spaced from and substantially parallel to the junction.

4. A process according to claim 1 in which the wafer is grooved by etching so that the groove trough areas are located to intersect the junction.

5. A process of forming from a single silicon crystal wafer a plurality of separate silicon crystal elements for use in semiconductor devices comprising epitaxially depositing onto a silicon crystal wafer having a first zone of a first conductivity type a second zone of a second, opposite conductivity type having a lower resistivity than the first zone to form a junction initially located between the zones, grooving the wafer through the first zone to a depth adjacent the second zone to separate at least a major portion of the first zone into sectors, heating the silicon crystal in an oxidizing atmosphere after epitaxial deposition and grooving to convert a portion of the first zone adjacent the second zone to the second conductivity type thereby moving the junction into the first zone away from the epitaxially deposited second zone and into edge association with the groove surfaces and simultaneously to deposit silicon dioxide on the silicon crystal surface, including the groove surfaces, at its intersection with the junction in the first zone, and sub-dividing the silicon crystal wafer through portions of the second zone underlying groove trough areas to form separately useable silicon crystal elements each including a sector of the first zone.

6. A process according to claim 5 in which the wafer is grooved by etching so that junction intersections with the groove surfaces are positively beveled to increase the voltage blocking capabilities of the silicon crystal elements.

7. A process of forming from a single silicon crystal wafer a plurality of separate silicon crystal elements for use in semiconductor devices comprising epitaxially depositing onto a silicon crystal wafer having a first zone of a first conductivity type a second zone of a second, opposite conductivity type having a lower resistivity than the first zone to form a junction initially located between the zones, forming a stressed region on a surface of the second zone, grooving the wafer through the first zone to a depth adjacent the second zone to separate at least a major portion of the first zone into sectors, heating the silicon crystal after epitaxial deposition, grooving, and stressing in an oxidizing atmosphere to convert a portion of the first zone adjacent the second zone to the second conductivity type thereby moving the junction into the first zone away from the epitaxially deposited second zone and into edge association with the groove surfaces, simultaneously to deposit silicon dioxide on the silicon crystal surface, including the groove surfaces, at its intersection with the junction in the first zone, and simultaneously to form crystal dislocations in the stressed region of the second zone capable of acting as traps for fast diffusing iron impurities, removing the stressed region of the second zone to thereby remove iron impurities, and sub-dividing the silicon crystal wafer through portions of the second zone underlying groove trough areas to form separately useable silicon crystal elements each including a sector of the first zone.

8. A process of forming from a single silicon crystal wafer a plurality of separate silicon crystal elements for use in thyristors comprising epitaxially depositing onto one major surface of a silicon crystal wafer initially formed of a first conductivity type zone a second, opposite conductivity type zone having a lower resistivity than the first zone to form a first junction initially located between the zones, forming on an opposed major surface of the silicon crystal wafer a third zone of the second conductivity type providing a second junction with the first zone and a fourth zone spaced from the first zone by the third zone of the first conductivity type and providing a third junction with the third zone, forming a stressed region on the second zone spaced from the first zone, etching the wafer through at least the first and third zones to a depth adjacent the second zone to separate the third and fourth zones and at least a portion of the first zone into sectors, heating the silicon crystal after epitaxial deposition, etching, and stressing in an oxidizing atmosphere to convert a portion of the first zone adjacent the second zone to the second conductivity type thereby moving the junction into the first zone away from the epitaxially deposited second zone and into edge association with the groove surfaces, simultaneously to deposit silicon dioxide on the crystal surface, including the groove surfaces, at its intersection with the junction in the first zone, and simultaneously to form crystal dislocations in the stressed region of the second zone capable of acting as traps for fast diffusing iron impurities, removing the stressed region of the second zone to thereby remove fast diffusing impurities, and sub-dividing the silicon crystal wafer through portions of the second zone underlying groove trough areas to form separately useable silicon crystal elements for thyristors each including a sector formed by grooving.

References Cited

UNITED STATES PATENTS

| | | | |
|---|---|---|---|
| 3,089,794 | 5/1963 | Marinace | 148—1.5 |
| 3,233,305 | 2/1966 | Dill | 148—175 X |
| 3,309,245 | 3/1967 | Haenichen | 148—187 |
| 3,442,724 | 5/1969 | Glück et al. | 148—187 |
| 3,532,539 | 10/1970 | Tokuyama et al. | 117—201 |
| 3,491,272 | 1/1970 | Huth et al. | 317—235/41.1 X |
| 3,149,395 | 9/1964 | Bray et al. | 148—175 X |
| 3,261,727 | 7/1966 | Dehmelt et al. | 148—175 |
| 3,461,359 | 8/1969 | Raithel et al. | 317—235/41.1 X |
| 2,802,760 | 8/1957 | Derick et al. | 148—1.5 |
| 3,523,838 | 8/1970 | Heidenreich | 148—175 |

OTHER REFERENCES

Ashar et al.: "Semiconductor Device Structure and Method of Making," IBM Tech. Discl. Bull., vol. 11, No. 11, April 1969, pp. 1529–30.

L. DEWAYNE RUTLEDGE, Primary Examiner

W. G. SABA, Assistant Examiner

U.S. Cl. X.R.

29—580, 590; 117—201, 212, 213; 148—187, 191; 317—235 R